United States Patent
Zhang et al.

(10) Patent No.: US 11,302,759 B2
(45) Date of Patent: Apr. 12, 2022

(54) DISPLAY DEVICE HAVING PIXELS IN A TRANSPARENT DISPLAY AREA AND OLED ARRAY SUBSTRATE THEREOF

(71) Applicant: KunShan Go-Visionox Opto-Electronics Co., Ltd., Kunshan (CN)

(72) Inventors: Lu Zhang, Kunshan (CN); Junhui Lou, Kunshan (CN)

(73) Assignee: KunShan Go-Visionox Opto-Electronics Co., Ltd., Kunshan (CN)

(*) Notice: Subject to any disclaimer, the term of this patent is extended or adjusted under 35 U.S.C. 154(b) by 0 days.

(21) Appl. No.: 17/038,517

(22) Filed: Sep. 30, 2020

(65) Prior Publication Data

US 2021/0013272 A1   Jan. 14, 2021

Related U.S. Application Data

(63) Continuation of application No. PCT/CN2019/092568, filed on Jun. 24, 2019.

(30) Foreign Application Priority Data

Dec. 28, 2018   (CN) .......................... 201811630050.2

(51) Int. Cl.
    *H01L 27/32*    (2006.01)
    *G09G 3/3258*    (2016.01)
    *G09G 3/3275*    (2016.01)

(52) U.S. Cl.
CPC ......... *H01L 27/326* (2013.01); *G09G 3/3258* (2013.01); *G09G 3/3275* (2013.01); *G09G 2300/0452* (2013.01)

(58) Field of Classification Search
CPC .................................................... H01L 27/326
(Continued)

(56) References Cited

U.S. PATENT DOCUMENTS

| 2016/0370574 A1 | 12/2016 | Cho et al. |
| 2018/0026082 A1 | 1/2018 | Lee et al. |

(Continued)

FOREIGN PATENT DOCUMENTS

| CN | 107425040 A | 12/2017 |
| CN | 107634083 A | 1/2018 |

(Continued)

OTHER PUBLICATIONS

International Search Report dated Aug. 29, 2019 in corresponding International application No. PCT/CN2019/092568; 4 pages.

(Continued)

*Primary Examiner* — Long D Pham
(74) *Attorney, Agent, or Firm* — Maier & Maier, PLLC

(57) ABSTRACT

A display device, a display panel and an OLED array substrate thereof are provided. As an example, the OLED array substrate includes a display driving chip and a display area, and the display area includes a non-transparent display area and a transparent display area. The non-transparent display area includes a plurality of first OLED pixels arranged in an array. The transparent display area includes a set of at least one column of second OLED pixels; A driving mode of the set of the at least one column of second OLED pixels is an active drive, and the set of the at least one column of second OLED pixels and the plurality of first OLED pixels are controlled by the display driving chip.

19 Claims, 13 Drawing Sheets

(58) Field of Classification Search
USPC .......................................................... 257/40
See application file for complete search history.

(56)                References Cited

U.S. PATENT DOCUMENTS

| 2018/0151649 A1 | 5/2018 | Han et al. |
| 2018/0204889 A1* | 7/2018 | Yu ....................... H01L 27/3223 |
| 2020/0052048 A1* | 2/2020 | Kuo ....................... G06F 1/1626 |
| 2020/0098318 A1* | 3/2020 | Liu ....................... G09G 3/3258 |
| 2020/0111401 A1* | 4/2020 | Zhao .................... G09G 3/2003 |

FOREIGN PATENT DOCUMENTS

| CN | 108122951 A | 6/2018 |
| CN | 108899348 A | 11/2018 |

OTHER PUBLICATIONS

Written Opinion of the International Searching Authority dated Aug. 29, 2019 in corresponding International application No. PCT/CN2019/092568; 4 pages.

* cited by examiner

DISPLAY DEVICE HAVING PIXELS IN A TRANSPARENT DISPLAY AREA AND OLED ARRAY SUBSTRATE THEREOF

CROSS-REFERENCE TO RELATED APPLICATIONS

This patent application is a continuation application of International Application No. PCT/CN2019/092568, filed on Jun. 24, 2019, which claims priority to Chinese Patent Application No. 201811630050.2, filed on Dec. 28, 2018 and entitled "Display Device, Display Panel And OLED Array Substrate Thereof", both of which are incorporated herein by reference in their entireties.

TECHNICAL FIELD

The present disclosure relates to the technical field of Organic Light-Emitting Diode (OLED) display devices, and in particular, to a display device, a display panel and an OLED array substrate thereof.

BACKGROUND

With the rapid development of display devices, users have developed increasingly high demands on screen occupation, and full-screen displays have gained increasingly attention in the industry. Since a screen need to be installed with components such as a camera, a sensor and an earphone, a part of the area on the screen is generally reserved for installing these components. For example, a notch area of an Apple mobile phone iphone X, which may affect the overall consistency of the screen.

SUMMARY

The present disclosure provides a display apparatus applicable to a full screen, a display panel and an OLED array substrate thereof, which change a driving mode of a transparent display area, solve the problem of inconsistency and non-synchronization of display images, and provide a full screen with higher quality.

A first aspect of the present disclosure provides an OLED array substrate. The OLED array substrate includes a display driving chip and a display area. The display area includes a non-transparent display area and a transparent display area. The non-transparent display area includes a plurality of first OLED pixels arranged in an array. The transparent display area includes a set of at least one column of second OLED pixels. A driving mode of the set of the at least one column of second OLED pixels is an active drive, and the set of the at least one column of second OLED pixels and the plurality of first OLED pixels are controlled by the display driving chip.

A second aspect of the present disclosure provides a display panel, which includes the OLED array substrate of the first aspect.

A third aspect of the present disclosure provides a display device, which includes the display panel of the second aspect.

The non-synchronization between the transparent display area and the non-transparent display area is that the transparent display area and the non-transparent display area use respective display drivers to provide switching signals and/or data signals, which are not associated with each other.

In the present disclosure, a driving mode for the second OLED pixels in the transparent display area is set as an active drive, which is consistent with the driving mode of the first OLED pixel in the non-transparent display area. Furthermore, the same display driving chip is adopted to drive the second OLED pixels in the transparent display area and the first OLED pixel in the non-transparent display area on the same OLED array substrate, that is, some data signal channels of the display driving chip are provided to the first OLED pixels, and some data signal channels are provided to columns of the second OLED pixels; data from the data signal channels corresponds to one frame displayed on the display area. Therefore, the data signal channels in the display driving chip are associated to realize consistent picture and driving synchronization.

DETAILED DESCRIPTION OF THE EMBODIMENTS

In order to make the above objects, features and advantages of the present disclosure more apparent, specific embodiments of the present disclosure will be described in detail below with reference to the accompanying drawings.

Figure 1:
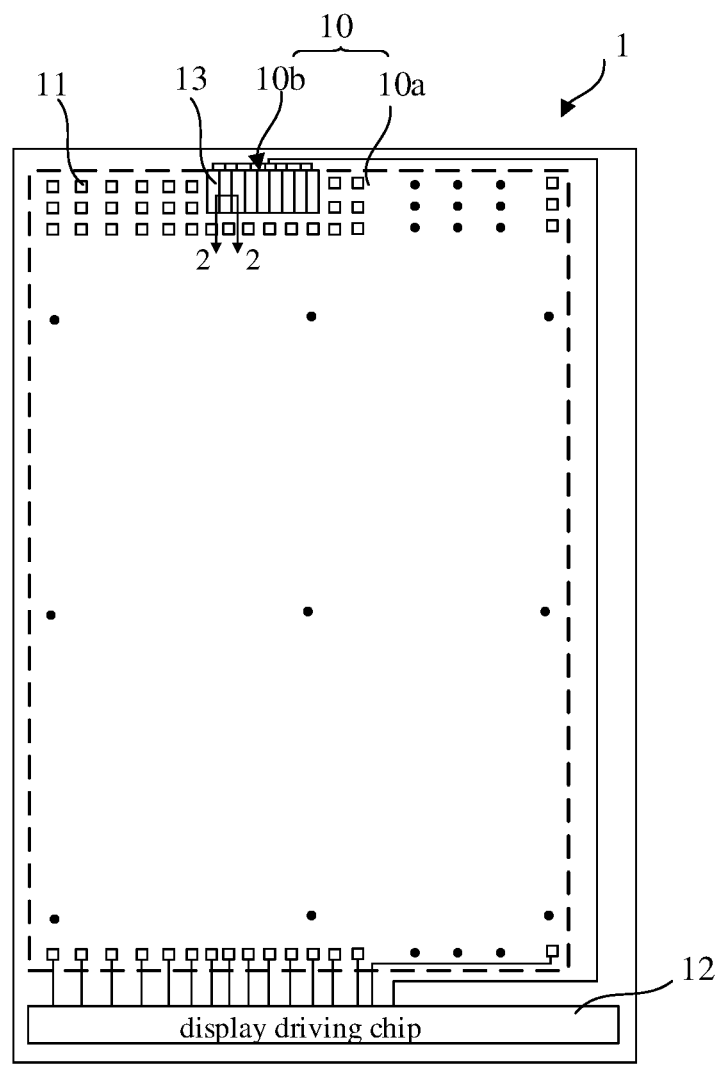
FIG. 1 is a top view of an OLED array substrate according to an embodiment of the present disclosure.
Figure 2:
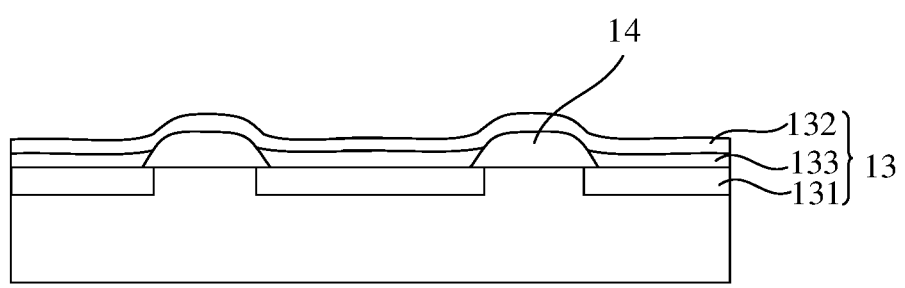
FIG. 2 is a sectional view taken along a line 2-2 in FIG. 1.

FIG. 1 is a top view of an Organic Light-Emitting Diode (OLED) array substrate in some embodiments of the present disclosure, and FIG. 2 is a sectional view taken along a line 2-2 in FIG. 1.

Referring to FIGS. 1 and 2, the OLED array substrate 1 includes a display area 10 and a display driving chip 12, and the display area 10 includes a non-transparent display area 10a and a transparent display area 10b. The display driving chip 12 includes a plurality of data signal channels.

The non-transparent display area 10a includes first OLED pixels 11 arranged in an array, and a first OLED pixel includes, from bottom to top, a block-shaped first electrode, an OLED light-emitting structure and a second electrode. Columns of the first OLED pixels 11 correspond to at least one data signal channel of the display driving chip 12. In the embodiments of the present disclosure, columns of the first OLED pixels 11 correspond to a plurality of data signal channels of the display driving chip 12.

In the embodiments, the transparent display area 10b includes one row of multiple columns of second OLED pixels 13. The each of at least one column of the second OLED pixels 13 includes first electrodes extending in a column direction, a plurality of OLED light-emitting structures spaced apart from each other on the first electrodes, and second electrodes on the plurality of light-emitting structures. When the columns of the second OLED pixels 13 are driven, the transparent display area 10b has a display function. When the columns of the second OLED pixels 13 are not driven, the transparent display area 10b has a light-transmitting function. The each of at least one column of the second OLED pixels 13 correspond to at least one data signal channel of the same display driving chip 12. The columns of the first OLED pixels 11 and the columns of the second OLED pixels 13 correspond to a plurality of data signal channels, and data output through the plurality of data signal channels corresponds to one frame of picture in the display area 10.

Referring to FIG. 2, a second OLED pixel 13 includes a first electrode 131 extending along a column direction, an OLED light-emitting structure 133 and a second electrode 132 according to a bottom-up order. The plurality of OLED light emitting structures 133 are separated by a pixel definition layer 14. The structure of the first OLED pixel 11 from bottom to top is the same as that of the second OLED pixel 13. In other examples, there may be no pixel definition layer between the OLED light-emitting structures 133. In another example, each column of the second OLED pixel 13 includes a first electrode, an OLED light-emitting structure 133 and a second electrode 132, which are extending in a column direction.

The second OLED pixel 13 differs from the first OLED pixel 11 in that, in columns of the second OLED pixels 13, the first electrodes 131 and the OLED light-emitting structures 133 penetrate through the transparent display area 10b, for example, extending from the top to the bottom of the transparent display area 10b. The second electrodes 132 in the columns of the second OLED pixels 13 may penetrate through the transparent display area 10b, for example, extending from the top to the bottom of the transparent display area 10b. In an example, as shown in FIG. 2, the second electrodes 132 of each column of the second OLED pixels 13 are plane electrodes. In another example, the second electrodes of the first OLED pixels and the second electrodes of the second OLED pixels are connected to form a plane electrode.

In FIG. 1 and FIG. 2, all columns of the second OLED pixels 13 in the transparent display area 10b have the same color. Optionally, all columns of the second OLED pixels 13 in the transparent display area 10b may be any one color of red, green, blue, yellow, etc. In other words, when the transparent display area 10b performs the display function, monochromatic light is emitted from the transparent display area.

In the case where all the columns of the second OLED pixels in one or two rows have the same color. In an example, for columns of the second OLED pixels which have the same color in one row, first electrodes of the pixels are connected to a drain of a drive transistor in a same pixel driving circuit, a gate of the drive transistor corresponds to one data signal channel of the display driving chip, and a source of the drive transistor is connected to a supply voltage. In another example, for columns of the second OLED pixels with the same color in a one row, the first electrode of each of the pixels may be connected to a drain of a drive transistor in one pixel driving circuit, a gate of each drive transistor corresponds to one data signal channel of the display driving chip, and a source of each drive transistor is connected to the same or different supply voltages. In the two examples above, the number of drive transistors in one pixel driving circuit in former example is smaller than that in latter example, and the occupied area thereof in former example is smaller than that in latter example. In addition, the number of data signal channels is smaller in former example, and thus the number of connecting wires and that of the occupied area thereof is smaller.

In the case where all rows of the second OLED pixels in one or two columns have the same color. In an example, for all rows of the second OLED pixels with the same color in one column, first electrodes of the pixels are connected to a drain of a drive transistor in a same pixel driving circuit, a gate of the drive transistor corresponds to one data signal channel of the display driving chip, and a source of the drive transistor is connected to a same supply voltage. In another example, for all rows of the second OLED pixels with the same color in two columns, first electrodes of the pixels may be connected to a drain of a drive transistor in a same pixel driving circuit, a gate of the drive transistor corresponds to a same data signal channel of the display driving chip, and a source of the drive transistor corresponds to a same supply voltage.

In the above two cases, when the transparent display area performs the display function, monochromatic light, such as red light, blue light, green light, etc. is emitted from the transparent display area.

In other examples, the first electrodes 131 and the OLED light-emitting structures 133 in the second OLED pixels 13 may be completely the same as the first OLED pixel 11, both being arranged in an array. In the transparent display area 10b of some embodiments of the present disclosure, the first electrodes 131 and the OLED light-emitting structures 133 of the second OLED pixels 13 are arranged in a plurality of columns penetrating through the transparent display area 10b (for example, extending from the top to the bottom of the transparent display area 10b), and with respect to a plurality of row-column units arranged in an array, it is possible that the boundary of the pattern film layer is reduced and the diffraction problem during light transmission is improved.

In an example, a group of at least one column of the second OLED pixels are arranged in any one of the following manners: multiple columns of a row, multiple columns of multiple rows. The multiple columns of multiple rows include multiple columns of two rows. In an example, for multiple columns of two rows, the colors of two rows of the second OLED pixels in one column are the same.

Hereinafter, the light-emitting driving method of the columns of the second OLED pixels 13 in the transparent display area 10b will be described.

Active driving OLED, also known as Active Matrix OLED (AMOLED), includes a Thin Film Transistor (TFT) array, and each TFT unit includes a storage capacitor. The AMOLED uses an independent thin film transistor to control each pixel to emit light, even control each pixel to emit light continuously. In other words, the addressing of each second OLED pixel 13 is directly controlled by TFT array. A row-select signal of the TFT array may be from a Gate-drive-Ic (integrated circuit)-in Panel (GIP) circuit, and a column-select signal of the TFT array may be from a Display Driver Ic Chip (DDIC). The Display Driver Ic Chip in the context is referred to simply as a display driving chip or DDIC. In the present disclosure, Active driving OLED means that a driving mode of a set of at least one column of second OLED pixels is an active drive.

Figure 3:
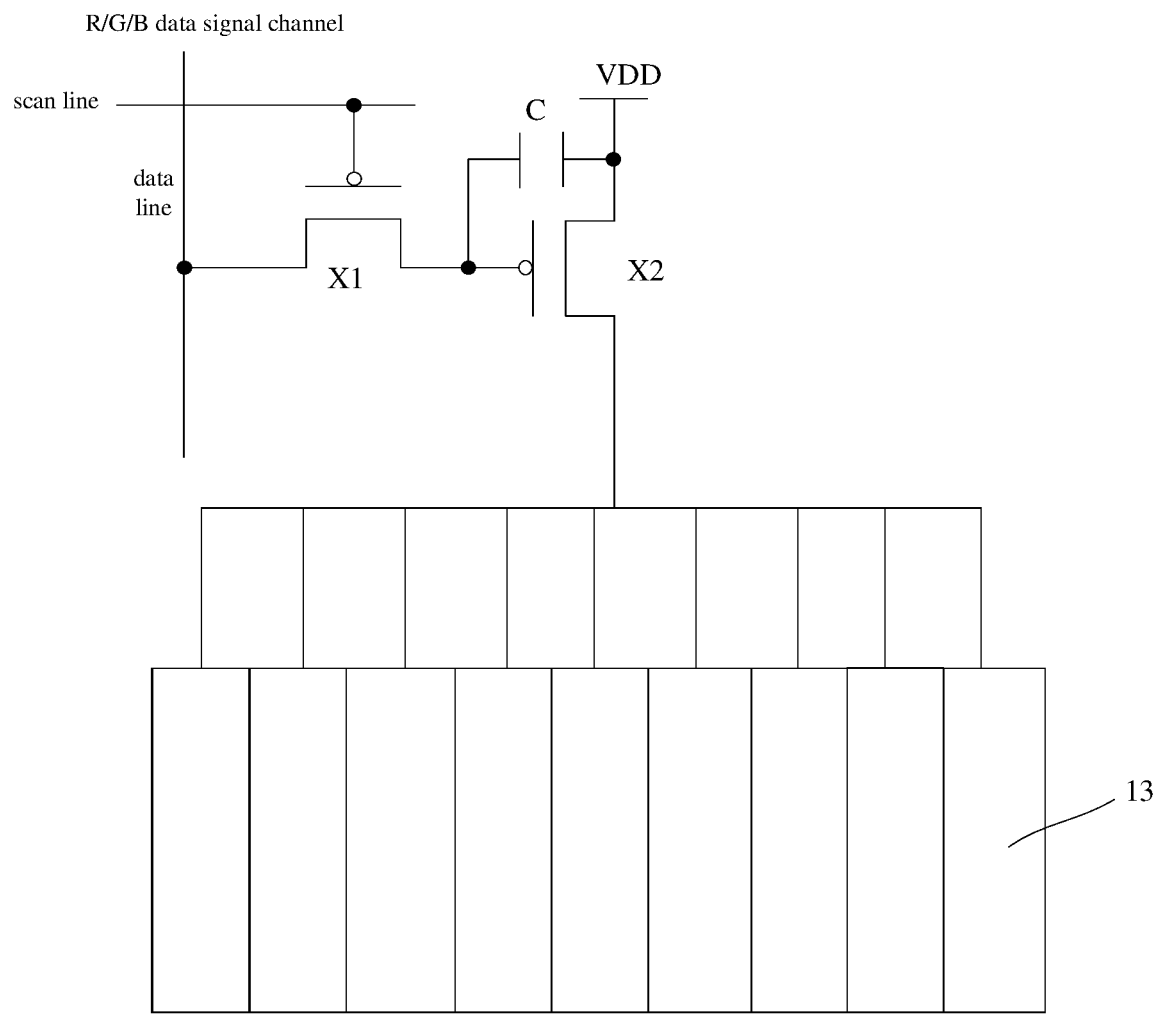
FIG. 3 is a schematic circuit diagram of an active drive circuit for each column of second OLED pixels in a transparent display area.

FIG. 3 is a schematic circuit diagram of an active drive for columns of second OLED pixels in a transparent display area. Referring to FIG. 3, first electrodes of the columns of the second OLED pixels 13 have first electrodes connected to a drain of a same drive transistor in a same pixel driving circuit, and second electrodes are grounded (when the second electrodes of the columns of second OLED pixels are connected and thus form a plane electrode, the plane electrode is grounded). A gate of the drive transistor corresponds to a same data signal channel of the display driving chip. In FIG. 3, the pixel driving circuit includes a switching transistor X1, a drive transistor X2 and a storage capacitor C. The data line may be connected to one data signal channel (i.e., the source line) of the DDIC; the scan line may be connected to one scanning signal channel of the GIP circuit. The remaining data channels of the display driving chip may be provided to columns of the first OLED pixels 11 in the non-transparent display area 10a, that is, each column of first OLED pixels 11 occupies one data signal channel. The remaining scanning signal channels of the GIP circuit may be provided to rows of the first OLED pixels 11 in the non-transparent display area 10a, that is, each row of the first OLED pixels 11 occupies one scanning signal channel. The gate of the drive transistor X2 is controlled by the R/G/B data signal in the data signal channel, to control the current magnitude of the supply voltage VDD flowing to each column of the first electrodes in the transparent display area 10b.

In an example, the remaining data signal channels of the display driving chip may be provided to columns of the first OLED pixels 11 in the non-transparent display area 10a. Each column of the first OLED pixels 11 occupies one data signal channel.

In another example, one data signal channel of the display driving chip occupied by columns of the second OLED pixels 13 may be shared with one column of the first OLED pixels 11 in the non-transparent display area 10a; each column of the first OLED pixels 11 occupies one data signal channel. In other words, there is one data signal channel supplied to one column of the first OLED pixels 11 and columns of the second OLED pixels 13 at the same time in the display driving chip. In addition, each column of the first OLED pixels 11 occupies one data signal channel.

In the above two examples, the latter example requires a smaller number of data signal channels of the display driving chip.

For the case where the data signal channels are shared, data output from data signal channels corresponding to columns of the first OLED pixels 11 in the non-transparent display area 10a corresponds to one frame displayed on the display area 10. For the case where the data signal channels are not shared, data output from data signal channels corresponding to the columns of the first OLED pixels 11 in the non-transparent display area 10a and data output from data signal channels corresponding to the columns of the second OLED pixels 13 in the transparent display area 10b correspond to one frame displayed on the display panel. Data output from data signal channels corresponds to one frame displayed on the display area 10, which means that, in one image refresh period, data from the data channels is resulted from processing one image.

In an example, the remaining scanning signal channels of the GIP circuit may be provided to the rows of first OLED pixels 11 in the non-transparent display area 10a. In another example, the columns of the second OLED pixels 13 in the transparent display area 10b share one scanning signal channel with one row of the first OLED pixels 11 in the non-transparent display area 10a.

Figure 4:
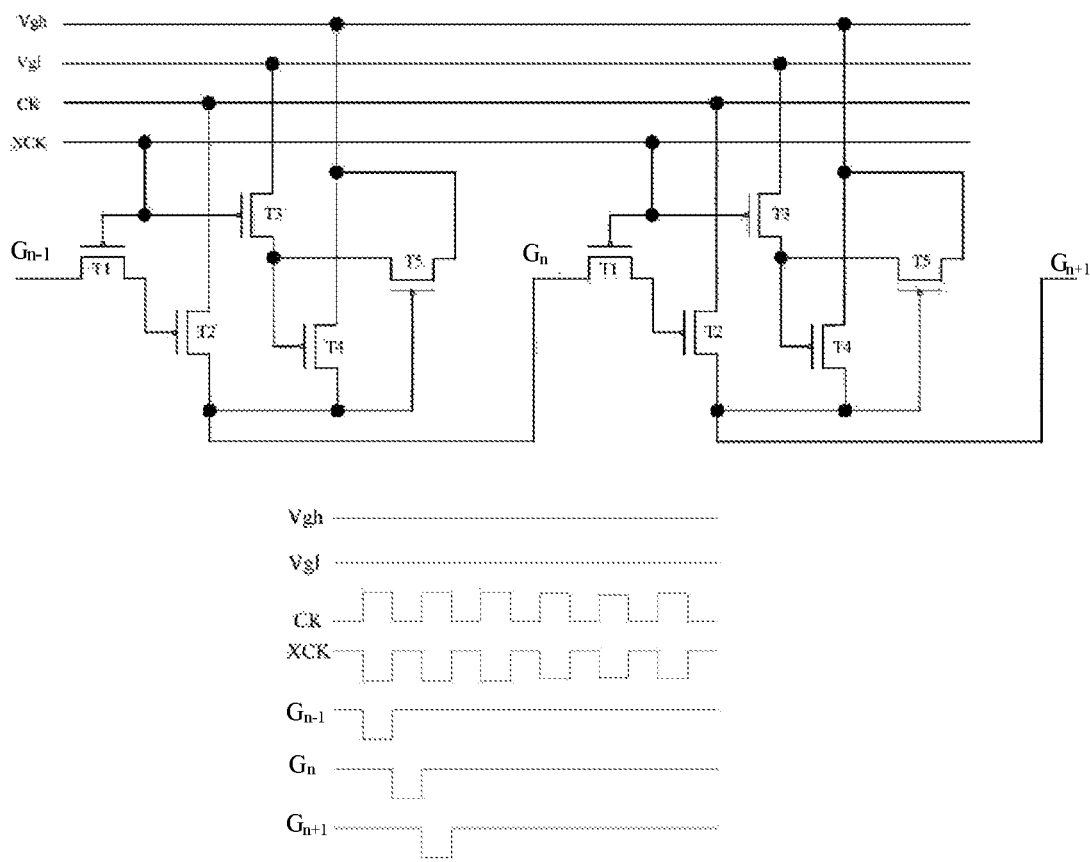
FIG. 4 is a circuit diagram and a timing diagram of a GIP circuit.

FIG. 4 is a GIP circuit and a timing diagram thereof. Referring to FIG. 4, the GIP circuit includes a first transistor T1, a second transistor T2, a third transistor T3, a fourth transistor T4, and a fifth transistor T5. A first clock signal line XCK is connected to a gate of the first transistor T1 and a gate of the third transistor T3, and a second clock signal line CK is connected to a source of the second transistor T2. A first gate line Vgh is connected to a source of the fourth transistor T4 and a source of the fifth transistor T5, and a second gate line Vgl is connected to a source of the third transistor T3. The OLED array substrate 1 may include a multi-stage GIP circuit, for example, an (n+1)-stage GIP circuit, where n is an integer greater than 1. A source of the first transistor T1 in an $n^{th}$ stage GIP circuit is connected to an input signal line Gn, which is an input signal of the $n^{th}$ stage GIP circuit. A drain of the second transistor T2 in the $n^{th}$ stage GIP circuit is connected to an output signal line of the $n^{th}$ stage GIP circuit, and an output signal from the $n^{th}$ stage GIP circuit serves as an input signal Gn+1 of the $n^{th}$ stage GIP circuit.

Referring to the waveform diagram driven by the GIP circuit in FIG. 4, the first gate line Vgh is at a high level, the second gate line Vgl is at a low level, and the first clock signal line XCK and the second clock signal line CK respectively output digital signals with opposite levels of either high or low. When the first clock signal line XCK jumps to a low level, the input signal line G1 of the first stage GIP circuit inputs a low level, and when the second clock signal line CK jumps to a low level, the first stage GIP circuit outputs a low level as the input signal G2 of the second stage GIP circuit, and so on. The output signal of the $n^{th}$ stage GIP circuit serves as the input signal of an $(n+1)^{th}$ stage GIP circuit.

In a specific implementation process, the supply voltage VDD in the pixel driving circuit may be adjustable to change the light emission brightness of the second OLED pixels 13 in the transparent display area 10b so as to be close to the light emission brightness of the first OLED pixels 11 in the non-transparent display area 10a.

In an example, the supply voltage VDD in the pixel driving circuit corresponding to the second OLED pixels 13 may be shared with the pixel driving circuit corresponding to the first OLED pixels 11. The supply voltage VDD may be from the display driving chip or from the power supply chip.

In another example, the supply voltage VDD in the pixel driving circuit corresponding to the second OLED pixels 13 is not shared with the supply voltage in the pixel driving circuit corresponding to the first OLED pixels 11. The supply voltage VDD corresponding to the second OLED pixels 13 may be from the power supply chip.

Figure 5:
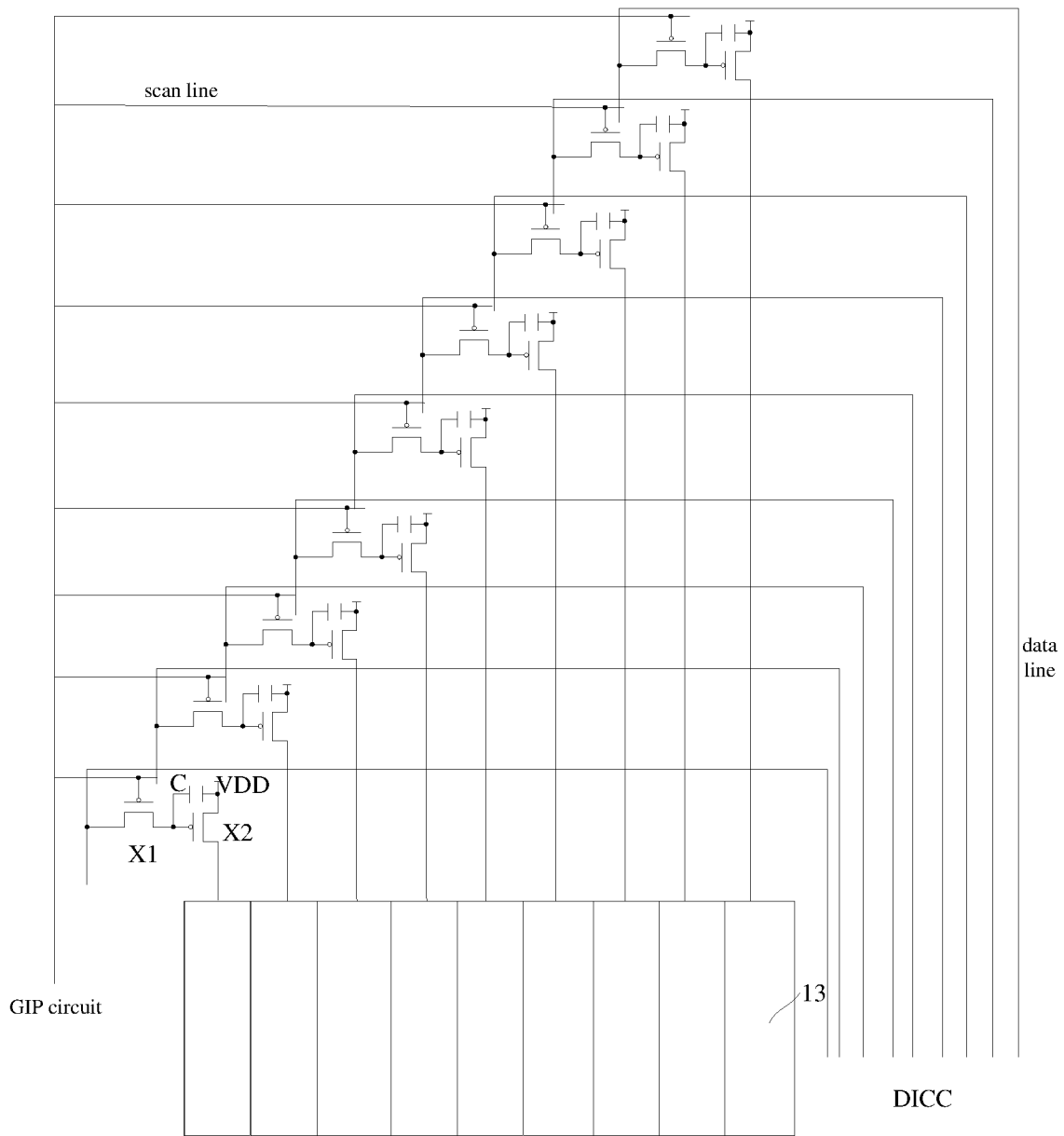
FIG. 5 is a schematic circuit diagram of another active drive circuit for each column of second OLED pixels in a transparent display area.

FIG. 5 is a schematic circuit diagram of another active drive for columns of second OLED pixels in the transparent display area. As shown in FIG. 5, the columns of second OLED pixels 13 have the first electrodes connected to drains of drive transistors in different pixel driving circuits, and the second electrodes are grounded (when the second electrodes of the columns of second OLED pixels are connected and thus form a plane electrode, the plane electrode is grounded). The gate of each drive transistor corresponds to one data signal channel of the display driving chip. In FIG. 5, the pixel driving circuit includes a transistor array including a plurality of transistor units, where each transistor unit includes a switching transistor X1, a drive transistor X2 and a storage capacitor C. Each transistor unit may have a data line connected to one data signal channel of the DDIC; scan lines of transistor units may be connected to one scanning signal channel of the GIP circuit. In other words, transistor units occupy a plurality of data signal channels of the DDIC (i.e., display driving chip) and one scanning signal channel of the GIP circuit.

In an example, apart from the data signal channels occupied by the transistor units in the second OLED pixels 13, the remaining data signal channels of the DDIC (i.e., display driving chip) may be provided to the columns of the first OLED pixels 11 in the non-transparent display area 10a. In another example, the data signal channel of the display driving chip occupied by a column of the second OLED pixels 13 may be shared with one column of the first OLED pixels 11 in the non-transparent display area 10a. In other words, in the data signal channels of the display driving chip, there is at least one data signal channel provided to both a column of the first OLED pixels 11 and a column of the second OLED pixels 13. In addition, each column of the first OLED pixels 11 occupies one data signal channel.

For the case where the data signal channels are sufficiently shared, data from data signal channels corresponding to columns of the first OLED pixels 11 in the non-transparent display area 10a correspond to one frame of picture in the display area 10. For the case where the data signal channels are not shared, data from the data signal channels corresponding to the columns of the first OLED pixels 11 in the non-transparent display area 10a and data from the data signal channels corresponding to the columns of the second OLED pixels 13 in the transparent display area 10b correspond to one frame displayed on the display area 10.

In an example, apart from one scanning signal channel occupied by the transistor units, the remaining scanning signal channels of the GIP circuit may be provided to rows of the first OLED pixels 11 in the non-transparent display area 10a. In another example, columns of the second OLED pixels 13 in the transparent display area 10b and one row of the first OLED pixels 11 in the non-transparent display area 10a share one scanning signal channel.

Figure 6:
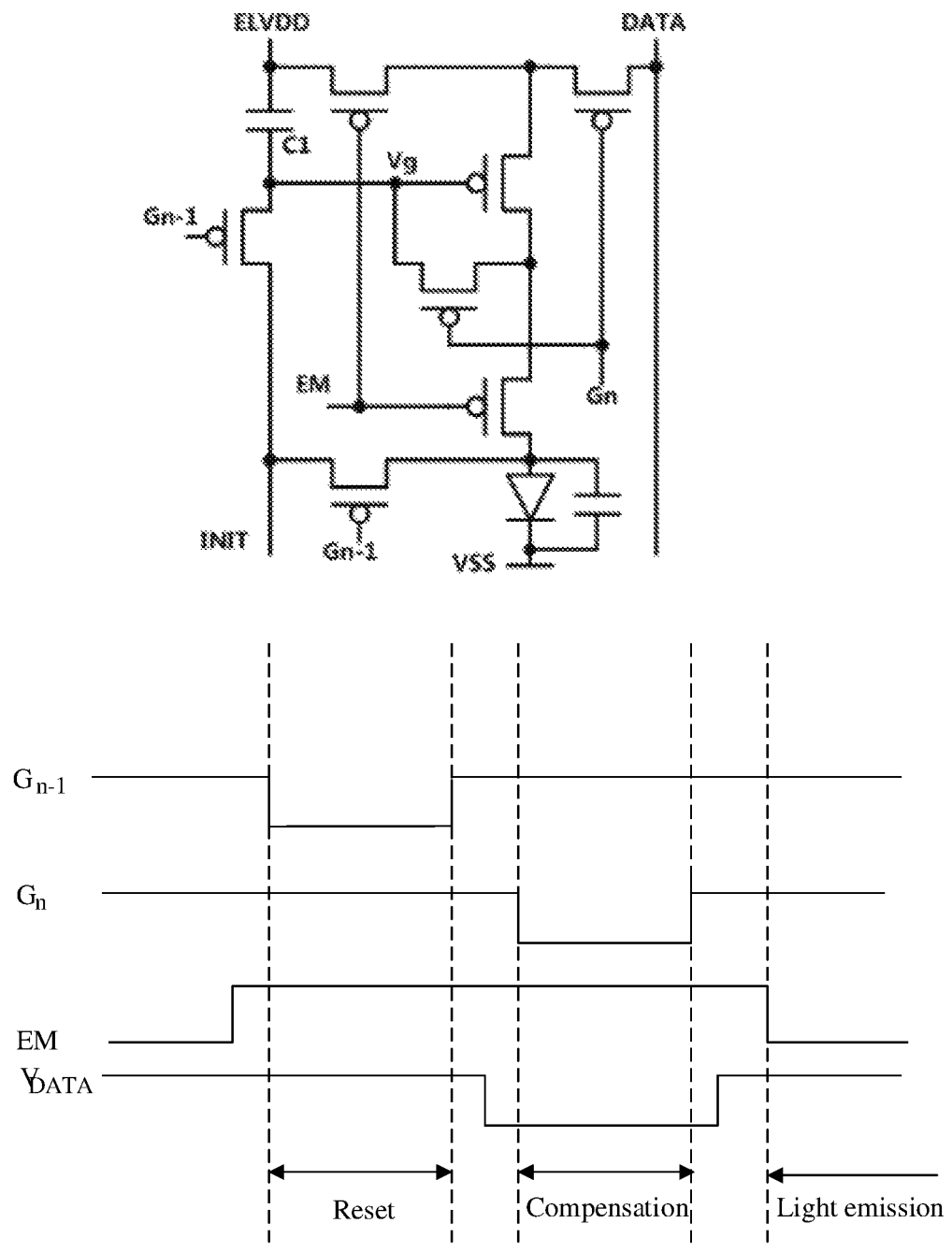
FIG. 6 is a circuit diagram and a timing diagram of a pixel driving circuit having a function of compensating a threshold voltage of a drive transistor.

FIG. 6 is a circuit diagram and a timing diagram of a pixel driving circuit having a function of compensating a threshold voltage of a drive transistor. In a specific implementation process, the pixel driving circuit may compensates the threshold voltage of the drive transistor, such as 7T1C and 6T1C, in addition to 2T1C described above, i.e. two thin film transistors and one capacitor. FIG. 6 shows a 7T1C pixel driving circuit, and the circuit is divided into three working phases: reset, compensation and light emission. The working principle is that the threshold voltage Vth of the drive transistor is firstly stored in its gate-source voltage Vgs during the compensation phase, and the voltage Vgs-Vth is converted into a current during the final light-emitting phase. Because Vgs already includes Vth, the influence of Vth is cancelled when the voltage Vth is converted into a current, current consistency is achieved. The circuit may prolong the service life and display uniformity of the second OLED pixels 13.

For the case where the first electrodes corresponding to the columns of the second OLED pixels 13 are connected to the drain of the same drive transistor in the pixel driving circuit, a gate of the drive transistor corresponds to one data signal channel of the display driving chip, and a source of the drive transistor is connected to a supply voltage. A data line signal VDATA of the pixel driving circuit may be one data signal from the display driving chip. The signals of the scan lines Gn−1 and Gn may come from two scan signals of the GIP circuit, the emission signal EM may come from one emission signal of the GIP circuit, and the initial signal INIT may be from the display driving chip.

In an example, the remaining data signal channels of the display driving chip may be provided to columns of the first OLED pixels 11 in the non-transparent display area 10a. Each column of the first OLED pixels 11 occupies one data signal channel.

In another example, one data signal channel of the display driving chip occupied by columns of the second OLED pixels 13 may be shared with one column of the first OLED pixels 11 in the non-transparent display area 10a, in other words, one data signal channel is provided to one column of the first OLED pixels 11 and columns of the second OLED pixels 13 at the same time in the data signal channels of the display driving chip. In addition, each column of the first OLED pixels 11 occupies one data signal channel.

For the case where data signal channel are shared, data from the data signal channels corresponding to columns of the first OLED pixels 11 in the non-transparent display area 10a corresponds to one frame displayed on the display area 10. For the case where the data signal channels are not shared, data from the data signal channels corresponding to the columns of the first OLED pixels 11 in the non-transparent display area 10a and data from the data signal channels corresponding to the columns of the second OLED pixels 13 in the transparent display area 10b correspond to one frame displayed on the display area 10.

In an example, for a pixel driving circuit of a compensation function, the remaining scanning signal channels of the GIP circuit may be provided to rows of the first OLED pixels 11 in the non-transparent display area 10a, that is, each row of the first OLED pixels 11 occupies two scanning signal channels, and two adjacent rows of the first OLED pixels 11 may share any one of the scanning signal channels. In another example, OLED pixels in the transparent display area 10b and one row of first OLED pixels 11 in the non-transparent display area 10a share two scanning signal channels.

In an example, for a pixel driving circuit having a compensation function, the remaining emission signal EM channels of the GIP circuit may be provided to rows of the first OLED pixels 11 in the non-transparent display area 10a, that is, each row of the first OLED pixels 11 occupies one row of emission signal EM channels. In another example, OLED pixels in the transparent display area 10b and one row of first OLED pixels 11 in the non-transparent display area 10a share one emission signal EM channel.

The initial signal INIT from the first OLED pixels 11 in the non-transparent display area 10a may be shared with columns of the second OLED pixels 13 in the transparent display area 10b.

In the case where the first electrodes corresponding to columns of the second OLED pixels 13 are connected to a drain of a drive transistor in a corresponding pixel driving circuit, a gate of the drive transistor corresponds to one data signal channel of the display driving chip, and a source of the drive transistor is connected to the same or different supply voltages, a data line signal VDATA of the pixel driving circuit of each column of the second OLED pixels 13 may be a data signal from the display driving chip; the signals of the scan lines Gn−1 and Gn may come from two scan signals of the GIP circuit, and the emission signal EM may come from one emission signal of the GIP circuit, and the initial signal INIT may be from the display driving chip. The data line signal VDATA of the pixel driving circuit corresponding to multiple columns of the second OLED pixels 13 may be from data signals of the display driving chip (DDIC. The signals of the scan lines Gn−1 and Gn may come from two scan signals of the GIP circuit, and the emission signal EM may come from one emission signal of the GIP circuit.

In an example, the remaining data signal channels of the display driving chip may be provided to columns of the first OLED pixels 11 in the non-transparent display area 10a, and each column of the first OLED pixels 11 occupies one data signal channel.

In another example, one data signal channel corresponding to one of columns of the second OLED pixels 13 may be shared with one column of the first OLED pixels 11 in the non-transparent display area 10a. In other words, there are a plurality of data channels in the display driving chip, each of which data channels is supplied to both a column of the first OLED pixels 11 and a column of the second OLED pixels 13. In addition, each column of the first OLED pixels 11 occupies one data signal channel.

For the case where the data signal channels are shared, data from data signal channels corresponding to columns of the first OLED pixels 11 in the non-transparent display area 10a correspond to one frame of picture in the display area 10. For the case where the data signal channels are not shared, data from the data signal channels corresponding to the columns of the first OLED pixels 11 in the non-transparent display area 10a and data from the data signal channels corresponding to the columns of the second OLED pixels 13 in the transparent display area 10b correspond to one frame of picture of the display area 10.

In an example, the remaining row scanning signals of the GIP circuit may be provided to rows of the first OLED pixels 11 in the non-transparent display area 10a, that is, each row of the first OLED pixels 11 occupies two scanning signal channels, and two adjacent rows share one scanning signal channel.

In another example, columns of the second OLED pixels 13 in the transparent display area 10b and one row of the first OLED pixels 11 in the non-transparent display area 10a share one scanning signal channel.

In the embodiment shown in FIG. 3 and FIG. 5, columns of the second OLED pixels 13 correspond to at least one pixel driving circuit and/or wiring thereof which is disposed in the bezel region of the OLED array substrate 1. In another example, columns of the second OLED pixels 13 correspond to at least one pixel driving circuit and/or wiring thereof which is disposed in the non-transparent display area 10a, or in a transition region (not shown) disposed between the transparent display area 10b and the non-transparent display area 10a. Compared with the solution provided in the transparent display area 10b, the pattern film layer of the transparent display area 10b may be reduced, thereby reducing the diffraction in a light transmission mode.

Compared with the embodiment shown in FIG. 5, the embodiment shown in FIG. 3 has the advantage that the number of channels corresponding to the data signal and the scanning signal can be reduced, and the number of connection wirings and the occupied area can be reduced.

Figure 7:
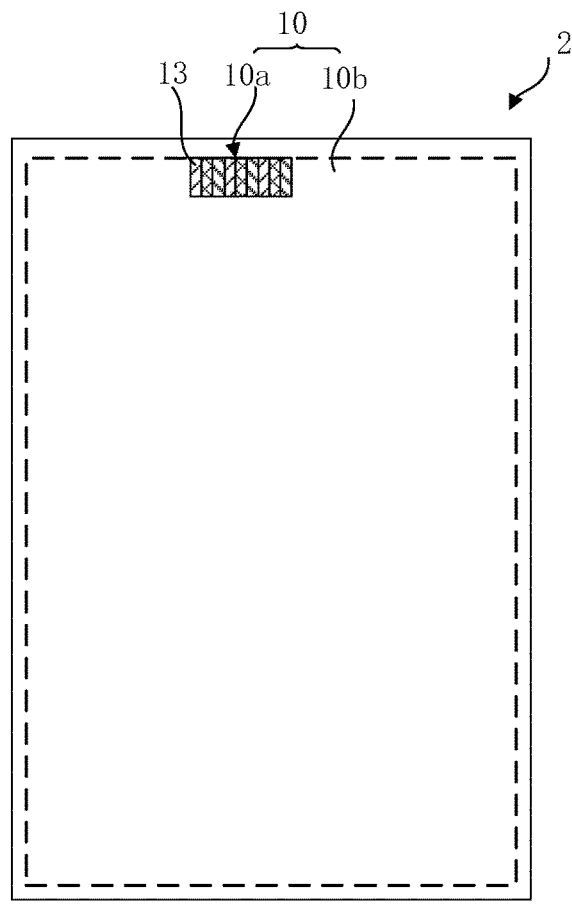
FIG. 7 is a top view of an OLED array substrate according to an embodiment of the present disclosure.

FIG. 7 is a top view of an OLED array substrate according to some embodiments of the present disclosure. The OLED array substrate 2 shown in FIG. 7 is substantially the same as the OLED array substrate 1 shown in FIG. 1, and the difference merely lies in that the columns of the second OLED pixels 13 has pixels with different colors in the same row, that is, pixels of three adjacent columns and in the same row have different colors, and these pixels with different colors form a pixel unit. In other words, at least one column of the second OLED pixels comprises pixels of different colors in a same row, the second OLED pixels of different colors in a same row form a plurality of pixel units. For example, a column of red pixels, a column of green pixels and a column of blue pixels adjacent to each other form a pixel unit. In other examples, the pixels in the pixel unit may also have other colors other than red, green, and blue. Compared with the pixel units in the non-transparent display area, the pixel units in the transparent display area may be regarded as pixel units in one row and several columns or two rows and several columns. As such, when the transparent display area performs the display function, pixels in pixel units emit light, and the display effect thereof is close to that of the non-transparent display area.

The specific structure of the second OLED pixel 13 may refer to the specific structure in the aforementioned embodiment, and different driving modes corresponding to pixels with the same color or different colors are introduced below.

Figure 8:
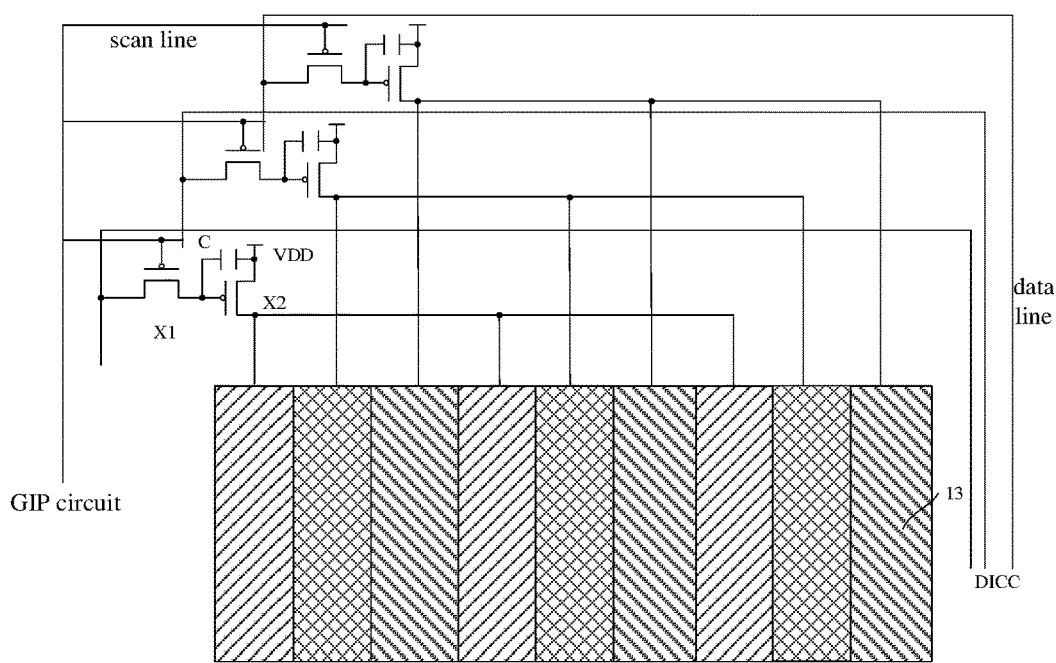
FIG. 8 is a schematic circuit diagram of an active drive circuit for each column of second OLED pixels in a transparent display area.

FIG. 8 is a schematic circuit diagram of an active drive for columns of second OLED pixels in a transparent display area. Referring to FIG. 8, first electrodes of pixels with the same color of pixel units are connected to a drain of a same drive transistor, a gate of the drive transistor corresponds to one data signal channel of the display driving chip, a source of the drive transistor corresponds to a supply voltage. In FIG. 8, the pixel driving circuit may include an array of transistors. The transistor array includes a plurality of transistor units. Each transistor unit may include a switching transistor X1, a drive transistor X2, and a storage capacitor C. The data line in each transistor unit may be connected to one data signal channel of a display driving chip (DDIC), and scan lines in the transistor units may be connected to one scanning signal channel of the GIP circuit. In other words, three data signal channels of the display driving chip are occupied, and one scanning signal channel of the GIP circuit is occupied.

The remaining scanning signal channels of the GIP circuit may be provided to rows of the first OLED pixels 11 in the non-transparent display area 10a, that is, each row of the first OLED pixels 11 occupies one scanning signal channel.

The supply voltage VDD may be adjustable to change the light emission brightness and gray scale of the second OLED pixels 13 in the transparent display area 10b so as to be close to the light emission brightness and gray scale of the first OLED pixels 11 in the non-transparent display area 10a.

In an example, the supply voltage VDD in the pixel driving circuit corresponding to the second OLED pixels 13 may be shared with the supply voltage VDD in the pixel driving circuit corresponding to the first OLED pixel 11. The supply voltage VDD may be from the display driving chip or from the power supply chip.

In another example, the supply voltage VDD in the pixel driving circuit corresponding to the second OLED pixels 13 may be not shared with the supply voltage in the pixel driving circuit corresponding to the first OLED pixel 11. For example, the supply voltage VDD corresponding to the second OLED pixels 13 is derived from the power supply chip, and the supply voltage VDD corresponding to the first OLED pixel 11 is derived from the display driving chip.

In an example, the remaining data signal channels of the display driving chip may be provided to columns of the first OLED pixels 11 in the non-transparent display area 10a. In another example, one data signal channel of the display driving chip occupied by the pixels with the same color of the second OLED pixels 13 may be shared with one column of the first OLED pixels 11 in the non-transparent display area 10a, in other words, at least one data signal channel is simultaneously provided to one column of the first OLED pixels 11 and columns of the second OLED pixels 13 in the display driving chip.

Figure 9:
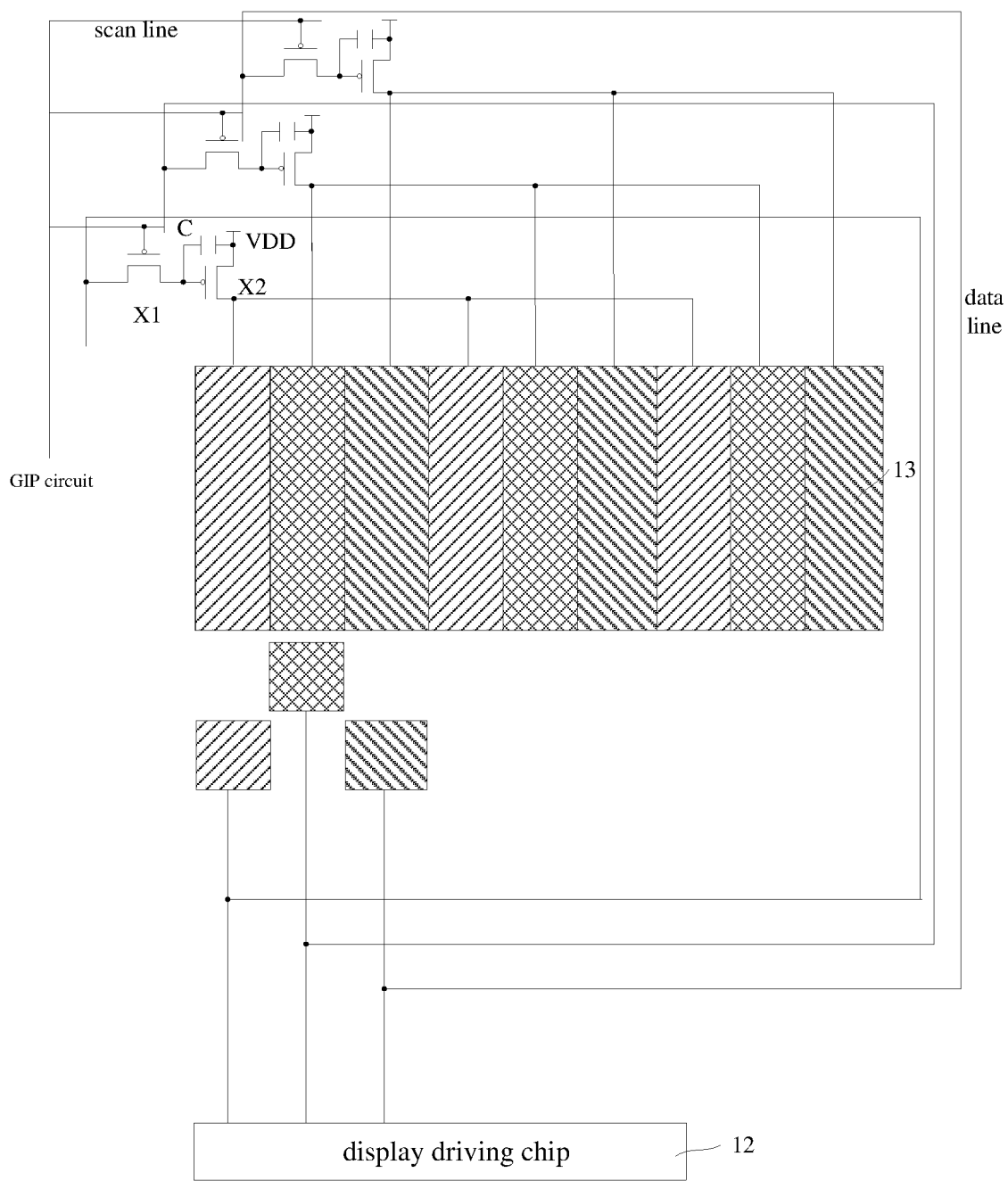
FIG. 9 is a schematic circuit diagram of another active drive circuit for first OLED pixels and second OLED pixels in an OLED array substrate.

FIG. 9 is a schematic circuit diagram of another active drive for first OLED pixels and second OLED pixels in the OLED array substrate. Referring to FIG. 9, the data signal channel of the columns of OLED pixels with the same color, such as red, in the transparent display area 10b, provided by the display driving chip 12 is shared with the leftmost red pixels in the row, which are adjacent to the transparent display area 10b and opposite to the transparent display area 10b, in the non-transparent display area 10a. The sharing method of the green pixels, the blue pixels and the red pixels is the same. In other examples, a data signal channel of the right-most red pixels in the opposite row may also be shared. The manner of sharing the data signal channel can reduce the number of channels on the display driving chip.

In an example, columns of the second OLED pixels 13 in the transparent display area 10b share one scanning signal channel with one row of the first OLED pixels 11 in the non-transparent display area 10a.

In another example, first electrodes corresponding to columns of pixels 13 with the same color in pixel units are connected to drains of different drive transistors, a gate of each of the drive transistors corresponds to one data signal channel of the display driving chip, and sources of each of the drive transistors correspond to the same or different supply voltages. The pixel driving circuit may include an array of transistors. Each transistor unit may include a switching transistor X1, a drive transistor X2, and a storage capacitor C. The data lines in the respective transistor units may be connected to three data signal channels of the display driving chip (DDIC). Scan lines in transistor units may be connected to one line scan signal of the GIP circuit. In other words, multiple data signal channels of the display driving chip and one scanning signal channel of the GIP circuit are occupied.

In an example, the remaining data signal channels of the display driving chip may be provided to columns of the first OLED pixels 11 in the non-transparent display area 10a. In another example, data signal channels of the display driving chip occupied by columns of the second OLED pixels 13 with the same color may be shared with one column of pixels with the same color in one pixel unit of the non-transparent display area 10a. In one example, a data signal channel provided by the display driving chip 12 to one column of pixels in the transparent display area 10b is shared with, the same color pixels in the non-transparent display area 10a which are adjacent to the transparent display area 10b and opposite to the column of pixels.

In a specific implementation process, pixel driving circuits connected to first electrodes corresponding to columns of pixels with the same color in the pixel units may be 6T1C or 7T1C, in addition to the 2T1C. Signals of the data lines of the above pixel driving circuits may be from one or more columns of source signals of the display driving chip (DDIC). A signal of the scan line may be from a scan signal of the GIP circuit.

The data from the data signal channels corresponding to columns of the first OLED pixels 11 in the non-transparent display area 10a and columns of the second OLED pixels 13 in the transparent display area 10b corresponds to one frame displayed on the display area 10.

In a specific implementation process, the data line signal VDATA of the pixel driving circuit may be from three or more data signal channels of the display driving chip (DDIC). The signals of the scan lines Gn−1, Gn, Gn+1, etc. may be from a plurality of scanning signal channels of the GIP circuit, and the emission signal EM may be from one emission signal channel of the GIP circuit, and the initial signal INIT may be from the display driving chip.

Figure 10:
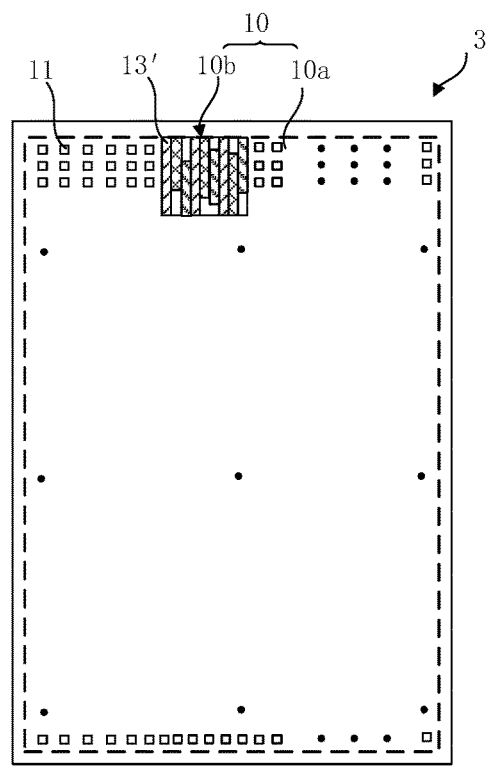
FIG. 10 is a top view of an OLED array substrate according to an embodiments of the present disclosure.

FIG. 10 is a top view of an OLED array substrate according to some embodiments of the present disclosure. Referring to FIG. 10, OLED array substrate 3 in the embodiments is substantially the same as the OLED array substrates 1 and 2 in the foregoing embodiments, and the difference lies in that the lengths of columns of the second OLED pixels 13 in the column direction are not completely the same and/or the positions thereof are not completely the same. That is to say, a certain column (e. g., a first column) of second OLED pixels 13' may extend in the column direction within a certain section of middle portion of the transparent display area 10b, a certain column (e. g., a second column) of the second OLED pixels 13' may extend from the top downward to the middle portion of the transparent display area 10b, and a certain column (e. g., a third column) of second OLED pixel 13' extend from the middle portion to the bottom of the transparent display area 10b. In an example, when the set of the at least one column of the second OLED pixels is in one row and multiple columns, first electrodes and light-emitting structures corresponding to each of the at least one column of the second OLED pixels extend along a column direction in a section in a middle of the transparent display area, or extend from a top end to the middle portion and a bottom of the transparent display area, or extend from a middle portion to the bottom of the transparent display area.

In an example, when the set of the at least one column of the second OLED pixels is in two rows and multiple columns, first electrodes and light-emitting structures corresponding to the a column of the second OLED pixels in a first row extend along a column direction in a section in a middle and upper of the transparent display area, or extend from a top end to middle and upper portion and a middle portion of the transparent display area, or extend from middle and upper portion to the middle of the transparent display area; and first electrodes and light-emitting structures corresponding to a column of the second OLED pixels in a second row extend along the column direction in a section of a middle-lower portion of the transparent display area, or extend from a bottom upward to the middle and lower portion and the middle portion of the transparent display area, or extend from the middle and lower portion to the middle portion of the transparent display area.

The advantage lies in that, unlike the foregoing solutions in which driving currents of different sizes are applied only on the first electrodes, and/or driving currents are applied to pixels of different colors to realize different patterns, the columns of the second OLED pixels 13' can, in combination with structures, form various patterns.

Columns of the second OLED pixels 13' in the above arrangement mode may have the same color, i.e. the transparent display area 10b is displayed in a single color. It is also possible to have different colors, that is, the transparent display area 10b is displayed in color.

Figure 11:
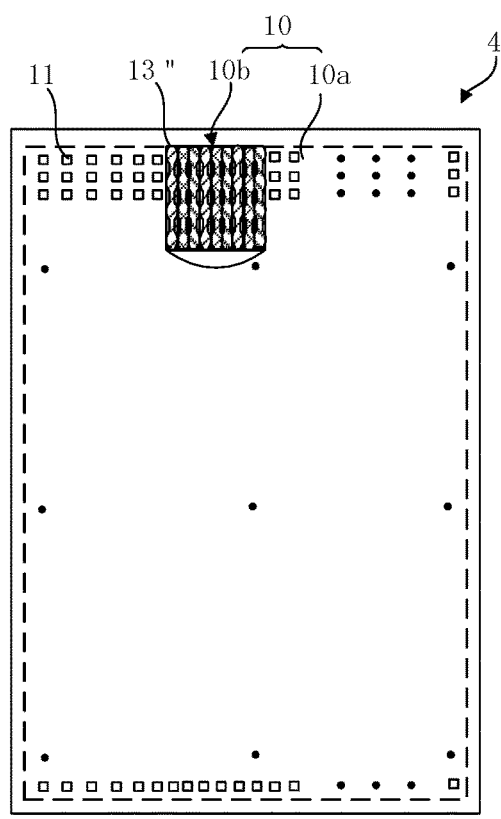
FIG. 11 is a top view of an OLED array substrate according to an embodiments of the present disclosure.

FIG. 11 is a top view of an OLED array substrate according to some embodiments of the present disclosure. Referring to FIG. 11, OLED array substrate 4 in the embodiments is substantially the same as the OLED array substrates 1, 2 and 3 in the foregoing embodiments, and the difference lies in that: a certain column, some columns, or all columns of second OLED pixels 13" form a cucurbit shape in the column direction. In other words, the first electrode and OLED light-emitting structure corresponding to the certain column, some columns, or all columns of second OLED pixels 13" have a cucurbit shape in the column direction. The above structure can further reduce the diffraction during light transmission with respect to the right-angle rectangle and the round-angle rectangle. In an example, projection of a first electrode corresponding to each of the second OLED pixels on a plane where the OLED array substrate is located shapes as any one or a combination of a circular, an elliptical, a dumbbell, a cucurbit, or a rectangle.

In an example, columns of the second OLED pixels 13" may be of the same color, that is, the transparent display area 10b is displayed in a single color. In another example, columns of the second OLED pixels 13" may be of different colors, that is, the transparent display area 10b is displayed in color.

Figure 12:
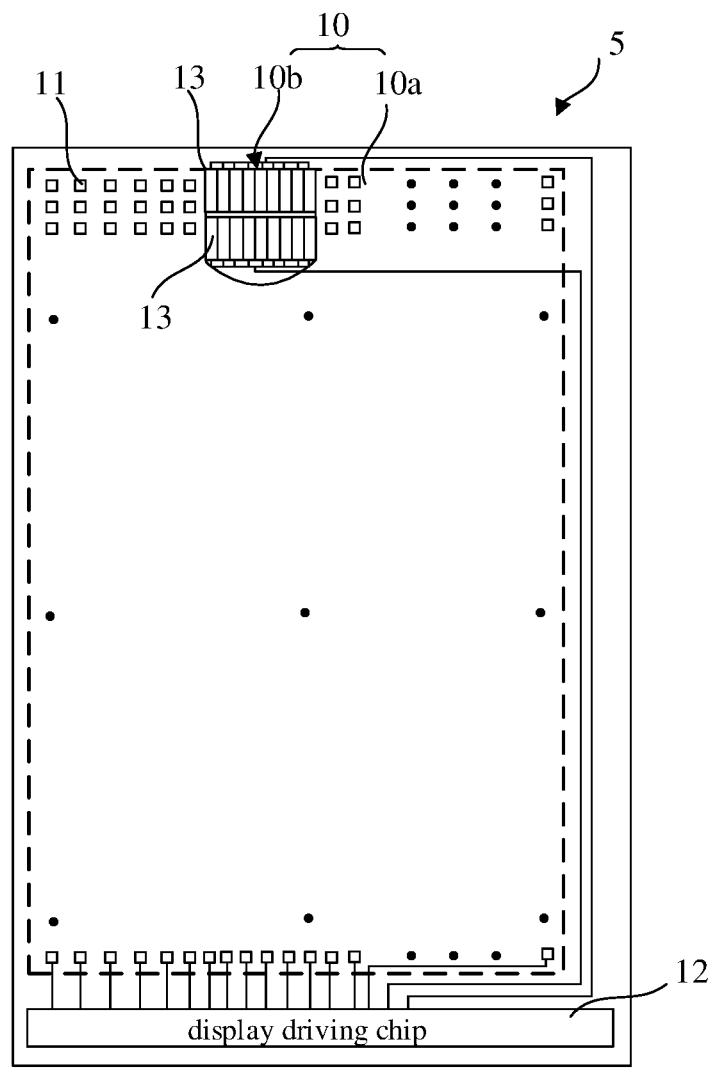
FIG. 12 is a top view of an OLED array substrate according to an embodiments of the present disclosure.

FIG. 12 is a top view of an OLED array substrate according to some embodiments of the present disclosure. Referring to FIG. 12, the structure of OLED array substrate 5 in the embodiments is substantially the same as that of the OLED array substrate 1 in the foregoing embodiments, and the difference lies in that the second OLED pixels 13 are distributed in two rows and multiple columns.

The structure of the two rows and multiple columns of the second OLED pixels 13 may refer to the structures in the foregoing embodiments.

Figure 13:
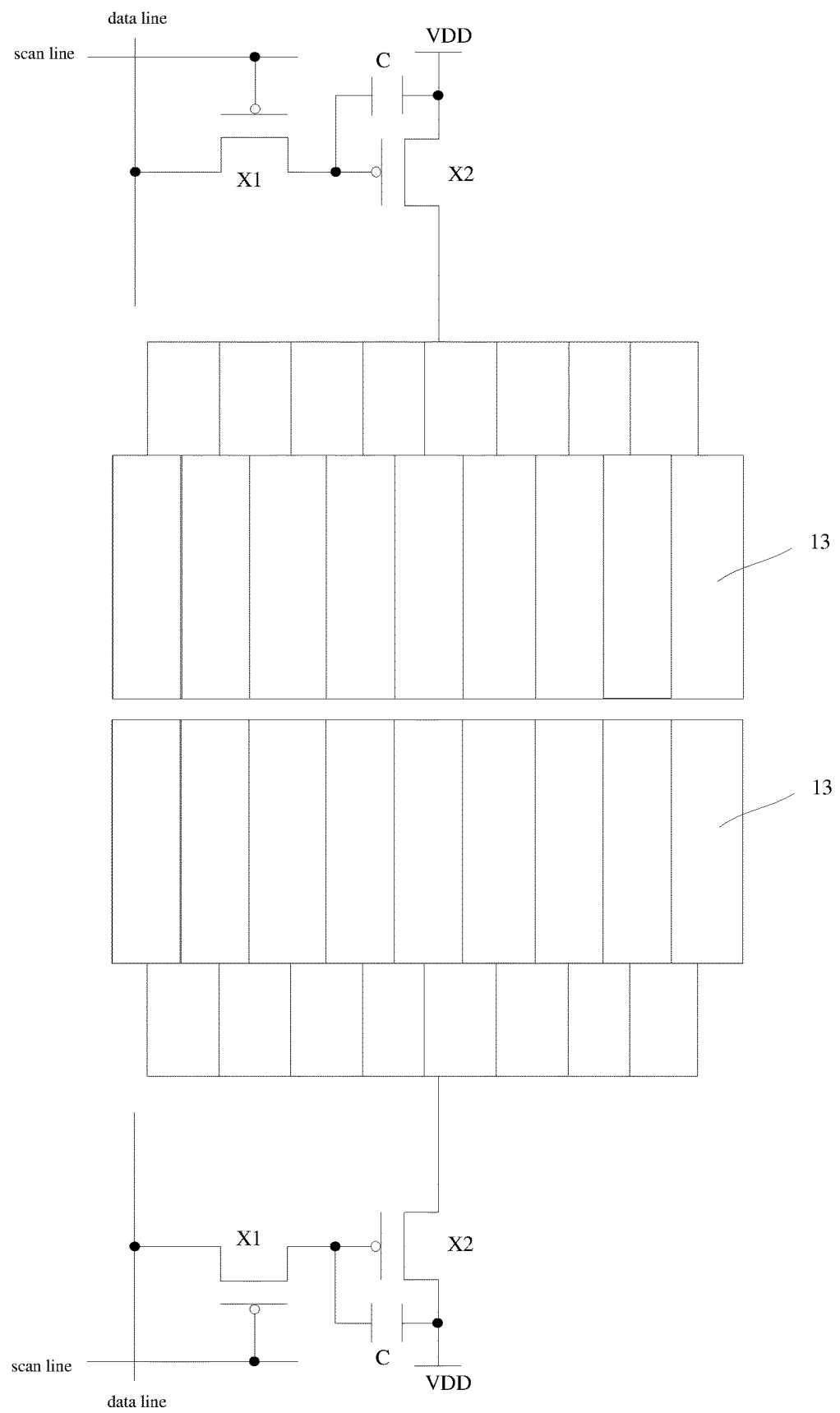
FIG. 13 is a schematic circuit diagram of an active drive circuit for each column of second OLED pixels in two rows in a transparent display area.

FIG. 13 is a schematic circuit diagram of an active drive for columns of second OLED pixels in two rows in a transparent display area. Compared with FIG. 3, first electrodes corresponding to columns of pixels with the same color in the first row is connected to a drain of a first drive transistor in a first pixel driving circuit, a gate of the first drive transistor corresponds to a first data signal channel of a display driving chip, and a source of the first drive transistor is connected to a first supply voltage; first electrodes corresponding to columns of pixels with the same color in the second row is connected to a drain of a second drive transistor in a second pixel driving circuit, a gate of the second drive transistor corresponds to a second data signal channel of the display driving chip, and a source of the second drive transistor is connected to a second supply voltage. In addition, columns of pixels with the same color in the first row and the second row corresponds to the same scanning signal. As such, the second OLED pixels in the transparent display area are turned on at the same time.

The pixel driving circuit in FIG. 13 takes 2T1C as an example, and in other examples, the pixel driving circuit may be 3T1C, 6T1C, or 7T1C.

Figure 14:
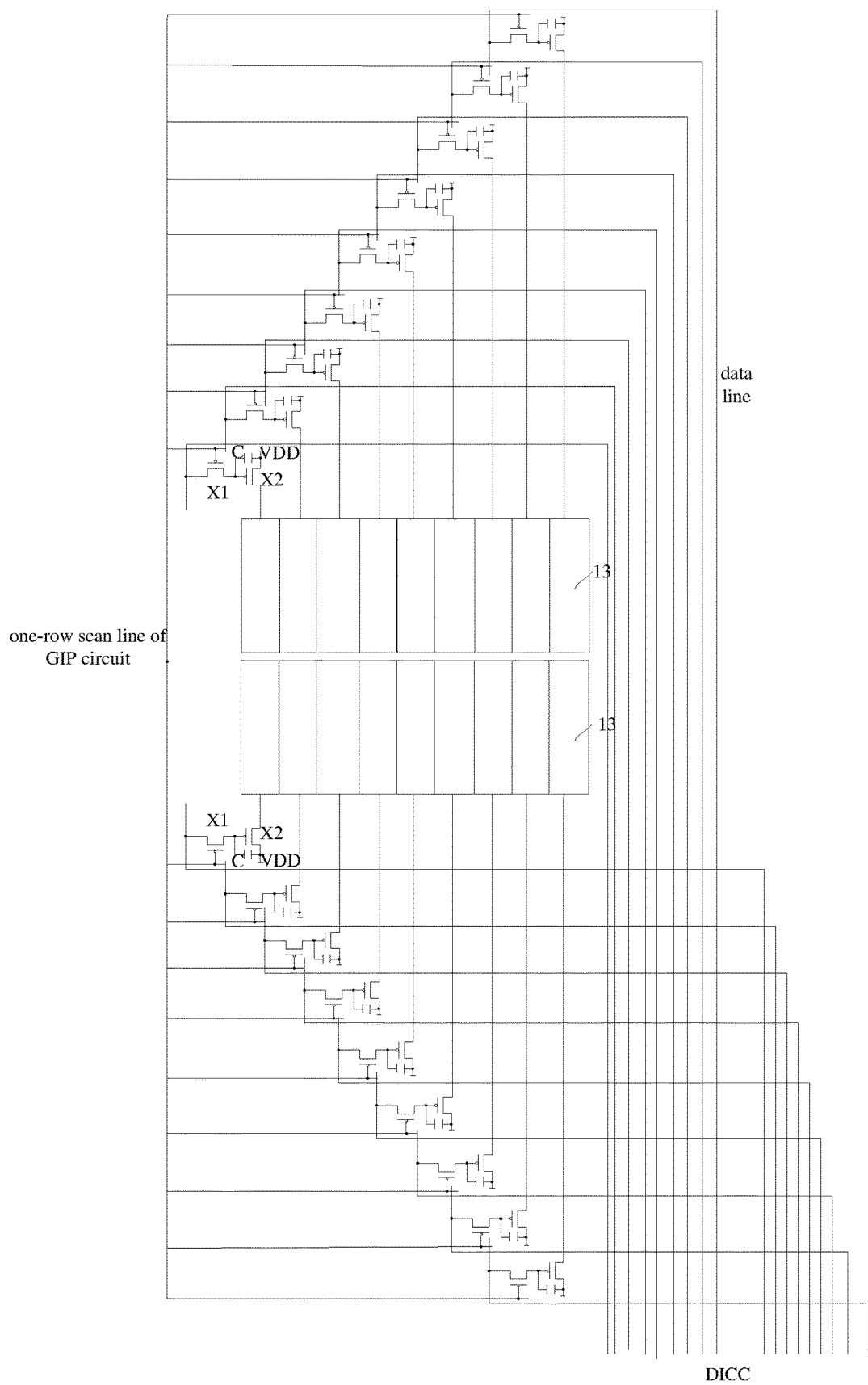
FIG. 14 is a schematic circuit diagram of another active drive circuit for each column of second OLED pixels in two rows in a transparent display area.

FIG. 14 is a schematic circuit diagram of another active drive for columns of second OLED pixels in two rows in a transparent display area. Compared with FIG. 5, first electrodes corresponding to columns of pixels with the same color in the first row is connected to a drain of a drive transistor in a pixel driving circuit, a gate of the drive transistor corresponds to a data signal channel of a display driving chip, and a source of the drive transistor is connected to a supply voltage, first electrodes corresponding to columns of pixels with the same color in the second row is connected to a drain of a drive transistor in a pixel driving circuit, a gate of the drive transistor corresponds to a data signal channel of the display driving chip, and a source of the drive transistor is connected to a supply voltage.

The pixel driving circuit in FIG. 14 takes 2T1C as an example, and in other examples, the pixel driving circuit may be 3T1C, 6T1C, or 7T1C.

Referring to the same-color pixel driving mode of FIG. 13 and FIG. 14, the driving for second OLED pixels 13 in two rows in the embodiments corresponds to the driving for two of the one row of second OLED pixels 13 in the previous embodiments. The difference lies in that the pixels in the upper and lower rows can share a data signal upon being driven.

In the case where columns of second OLED pixels in two rows are pixels with multiple colors, the colors of the upper and lower rows of the pixels in one column may be the same. Here, the two rows of the pixels may respectively correspond to a data signal, or may share a column of data signals. In addition, columns of pixels with the same color in the first row and columns of pixels with the same color in the second row correspond to the same scanning signal. In other words, the second OLED pixels 13 in the transparent display area are simultaneously turned on.

In the embodiments of the present disclosure, "row" and "column" are two relative concepts. In the process of arranging the OLED array substrate, it is possible that the relative positions of "row" and "column" are changed due to changes in position and/or angle of the OLED array substrate. An arrangement of "multiple rows and one column" of second OLED pixels may be directly derived or inferred from the arrangement of the "one row and multiple columns" of second OLED pixels according to the above embodiments. In addition, a person skilled in the art would adjust the number of the second OLED pixels in rows/columns in practical applications according to the embodiments of the present disclosure. For example, the arrangement of the second OLED pixels in "one row and multiple columns" according to the above embodiments is adjusted to the arrangement of second OLED pixels in "multiple rows and multiple columns" and the arrangement of second OLED pixels in "one row and one column". In the following embodiments, second OLED pixels in "multiple rows and one column" or "one row and one column" are taken as an example for detailed description.

Figure 15:
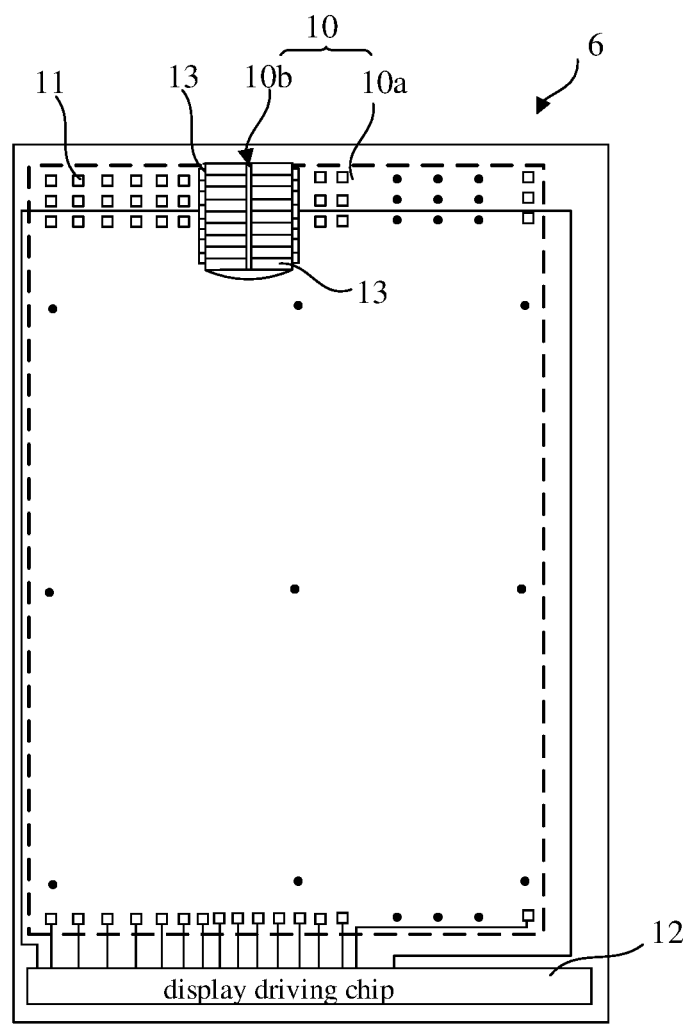
FIG. 15 is a top view of an OLED array substrate according to an embodiments of the present disclosure.

FIG. 15 is a top view of the OLED array substrate according to some embodiments of the present disclosure. Referring to FIG. 15, the OLED array substrate 6 in the embodiments includes a display area 10 and a display driving chip 12, and the display area 10 includes a non-transparent display area 10a and a transparent display area 10b. The display driving chip 12 includes a plurality of data signal channels.

The non-transparent display area 10a includes first OLED pixels 11 arranged in an array, and the first OLED pixels include, from bottom to top, block-shaped first electrodes, OLED light-emitting structures and second electrodes. Columns of the first OLED pixels 11 correspond to at least one data signal channel of the display driving chip 12.

In the embodiments, the transparent display area 10b includes multiple rows of the second OLED pixels 13 in two columns Columns of the second OLED pixels 13 includes first electrodes extending in the row direction, a plurality of OLED light-emitting structures spaced apart from each other on the first electrode, and second electrodes on the plurality of light-emitting structures. When multiple rows of the second OLED pixels in two columns are driven, a display function of the transparent display area 10b is enabled. When rows of the second OLED pixels in two columns are not driven, a light-transmitting function of the transparent display area 10b is enabled. Rows of the second OLED pixels in two columns correspond to at least one data signal channel of the same display driving chip. Data from data signal channels corresponding to rows of the first OLED pixels 11 and rows of the second OLED pixels 13 corresponds to one frame displayed on the display area 10.

Compared with the OLED array substrate 5 in the embodiments shown in FIG. 12, the difference lies in that the second OLED pixels 13 are distributed in two columns and multiple rows.

The first electrodes corresponding to each row of second OLED pixels 13 extend in the row direction.

Figure 16:
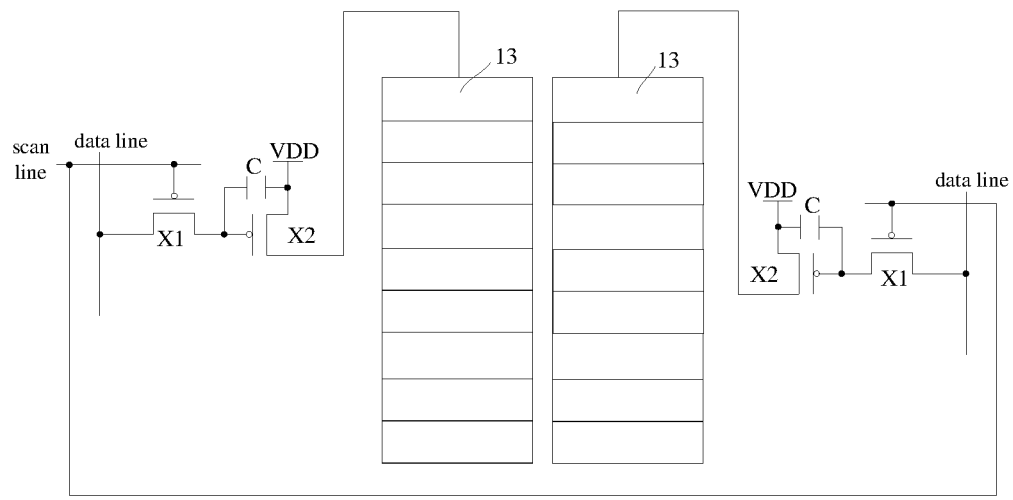
FIG. 16 is a schematic circuit diagram of an active drive circuit for each row of second OLED pixels in two columns in a transparent display area.

FIG. 16 is a schematic circuit diagram of an active drive for rows of second OLED pixels in two columns in a transparent display area. Referring to FIG. 16, first electrodes corresponding to rows of same color pixels in the same column are connected to a drain of a drive transistor in the same pixel driving circuit, a gate of the drive transistor corresponds to a same data signal channel of a display driving chip, and a source of the drive transistor is connected to a supply voltage. In other words, the transparent display area occupies two data signal channels.

In other examples, first electrodes corresponding to rows of pixels with the same color in one column are connected to a drain of a drive transistor in a pixel driving circuit, a gate of the drive transistor corresponds to one data signal channel of a display driving chip, and a source of the drive transistor is connected to a supply voltage. Optionally, first electrodes corresponding to rows of pixels with the same color in two columns may be connected to a drain of a drive transistor in the same pixel driving circuit, a gate of the drive transistor corresponds to the same data signal channel of the display driving chip, and a source of the drive transistor is connected to a supply voltage.

In addition, in one column of second OLED pixels, one or more rows of second OLED pixels may share the same data signal channel of the display driving chip with one row of first OLED pixels.

In an example, the second OLED pixel is arranged in the form of one column and several rows, or two columns and several rows, which is possible to reduce the boundary of the pattern film layer and improve the diffraction problem during light transmission, and therefore the imaging effect of the optical sensor in the transparent display area is good.

The pixel driving circuit in FIG. 16 takes 2T1C as an example, and in other examples, may also be a pixel driving circuit such as 3T1C, 6T1C, and 7T1C.

Figure 17:
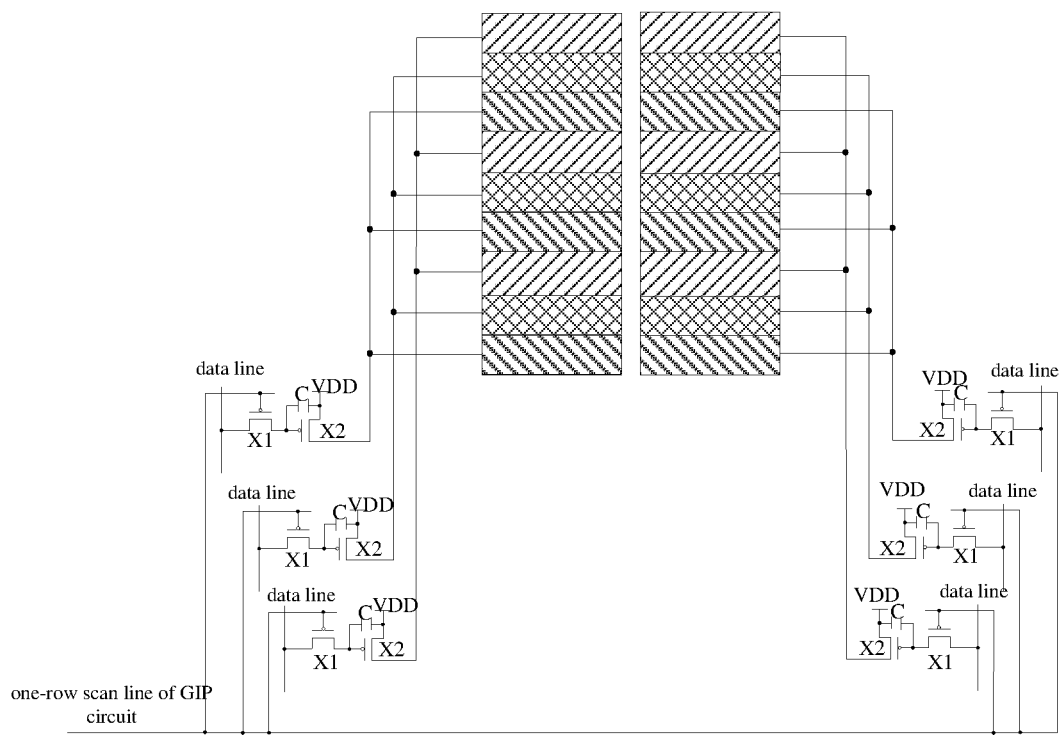
FIG. 17 is a schematic circuit diagram of an active drive circuit for each row of second OLED pixels in two columns in a transparent display area.

FIG. 17 is a schematic circuit diagram of an active drive for multiple rows of second OLED pixels in two columns in a transparent display area. Referring to FIG. 17, in one column of second OLED pixels, first electrodes corresponding to rows of pixels with the same color of pixel units (which are formed by three rows and two columns of pixels) are connected to a drain of a drive transistor in the same pixel driving circuit, and a gate of the drive transistor corresponds to one data signal channel of the display driving chip. In an example, in one column of the second OLED pixels, first electrodes corresponding to the respective rows of pixels with the same color in the respective pixel units are connected to the drains of the drive transistors in different pixel driving circuits, a gate of each of the drive transistors corresponds to one data signal channel of the display driving chip, and a source of each of the drive transistors is connected to a supply voltage. In another example, in two columns of second OLED pixels, first electrodes corresponding to rows of pixels with the same color in pixel units are connected to a drain of a drive transistor in the same pixel driving circuit, a gate of each drive transistor corresponds to a data signal channel of a display driving chip, and a source of each drive transistor is connected to a supply voltage.

By means of the above method, compared with the pixel units of the non-transparent display area, the pixel units in the transparent display area may be regarded as pixel units of one column and several rows, or two columns and several rows, and thus, when the display function of the transparent display area is enabled, pixels in pixel units emit light, and the display effect thereof is close to the display effect of the non-transparent display area.

The pixel driving circuit in FIG. 17 takes 2T1C as an example, and in other examples, the pixel driving circuit may also be a pixel driving circuit such as 3T1C, 6T1C, and 7T1C.

Figure 18:
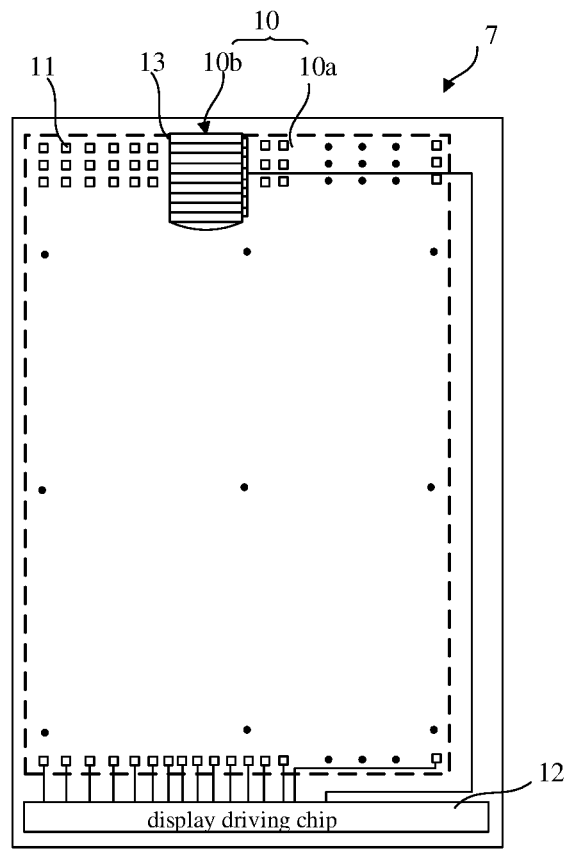
FIG. 18 is a top view of the OLED array substrate according to an embodiment of the present disclosure.

FIG. 18 is a top view of the OLED array substrate according to some embodiments of the present disclosure. Referring to FIG. 18, the OLED array substrate 7 in the embodiments differs from the OLED array substrate 6 in FIG. 15 in that, the second OLED pixels, with one column omitted, in the other column extend along a row direction. Correspondingly, for the structure of the second OLED pixels of the embodiments, reference is made to the structure of the second OLED pixel in FIG. 15. The pixel driving circuit of the embodiments may omit one set of pixel driving circuits in FIGS. 16 to 17.

Some embodiments of the present disclosure further provide a display panel with an encapsulation layer on the OLED array substrate. In addition to being used as a display device, the display panel may be provided with a touch layer thereon, and be used as a touch panel. The display panel may also be integrated and assembled as a semi-finished product with other components to form a display device such as a mobile phone, a tablet computer, a vehicle-mounted display screen, etc.

In the display device, an optical sensor is correspondingly disposed below the transparent display area 10b of the display panel, and the optical sensor includes at least one of a camera, an iris recognition sensor or a fingerprint recognition sensor.

Although some embodiments are described as above, the present disclosure is not limited thereto. Any person skilled in the art would have been able to make various changes and modifications without departing from the spirit and scope of the present disclosure. The scope of the present disclosure is defined by the claims.

The invention claimed is:

1. An organic light-emitting diode (OLED) array substrate, comprising:
　　a display driving chip;
　　a display area,
　　　a non-transparent display area comprising a plurality of first OLED pixels arranged in an array; and a transparent display area comprising a set of at least one column of second OLED pixels,
wherein a driving mode of the set of the at least one column of second OLED pixels is an active drive, and the set of the at least one column of second OLED pixels and the plurality of first OLED pixels are controlled by the display driving chip,
wherein each of the at least one column of the second OLED pixels comprises a plurality of first electrodes extending in a column direction, a plurality of OLED light-emitting structures disposed on the first electrode and separated from each other, and a plurality of second electrodes disposed on the OLED light-emitting structures;
when the at least one column of the second OLED pixels are driven, the transparent display area has a display function; when the at least one column of the second OLED pixels are not driven, the transparent display area has a light-transmitting function; and
the each of the at least one column of the second OLED pixels and each column of the first OLED pixels correspond to a plurality of data signal channels of the display driving chip, and data output from the plurality of data signal channels corresponds to one frame displayed on the display area.

2. The OLED array substrate according to claim 1, wherein the set of at least one column of second OLED pixels is arranged in any one of:
one row and multiple columns; or
multiple rows and multiple columns, wherein, in a case of two rows and multiple columns, the two rows of the second OLED pixels in a same column are of a same color.

3. The OLED array substrate according to claim 1, wherein the second OLED pixels correspond to at least one pixel driving circuit which is disposed in at least one of the non-transparent display area, a bezel region, or a transition region between the transparent display area and the non-transparent display area.

4. The OLED array substrate according to claim 1, further comprising one pixel driving circuit, wherein the second OLED pixels are of a same color,
the first electrodes of the second OLED pixels of the same color are connected to a drain of a drive transistor in a same pixel driving circuit, a gate of the drive transistor corresponds to a same data signal channel of the display driving chip, and a source of the drive transistor corresponds to a supply voltage.

5. The OLED array substrate according to claim 4, wherein the supply voltage is adjustable.

6. The OLED array substrate according to claim 1, further comprising a plurality of pixel driving circuits,
the at least one column of the second OLED pixels comprises a plurality columns of the second OLED pixels, the second OLED pixels in a same row have different colors, the second OLED pixels of different colors in a same row form a plurality of pixel units; and
in a row of the second OLED pixels, first electrodes corresponding to columns of pixels with a same color, each of the first electrodes is connected to a drain of a drive transistor in a same driving circuit or in different driving circuits, each gate of the drive transistor corresponds to one data signal channel of the display driving chip, and each source of the drive transistor corresponds to a supply voltage.

7. The OLED array substrate according to claim 1, wherein a column of the second OLED pixels share a same data signal channel of the display driving chip with a column of the first OLED pixels.

8. The OLED array substrate according to claim 1, wherein a column of the second OLED pixels and a column of the first OLED pixels respectively correspond to different data signal channels of the display driving chip.

9. The OLED array substrate according to claim 1, wherein a row of the second OLED pixels share a same scanning signal channel with a row of the first OLED pixels.

10. The OLED array substrate according to claim 1, wherein a pixel driving circuit corresponding to the second OLED pixels has a function of compensating a threshold voltage for a drive transistor.

11. The OLED array substrate according to claim 1, wherein a switching signal in a pixel driving circuit corresponding to the second OLED pixels is from at least one scanning signal channel of a Gate-drive-Ic (integrated circuit)-in Panel (GIP) circuit, and a switching signal in a pixel driving circuit corresponding to the first OLED pixels comes from at least one scanning signal channel of the GIP circuit.

12. The OLED array substrate according to claim 1, wherein the second electrodes of each column of the second OLED pixels are plane electrodes.

13. The OLED array substrate according to claim 1, wherein the second electrodes of the first OLED pixels and the second electrodes of the second OLED pixels are connected to form a plane electrode.

14. The OLED array substrate according to claim 1, wherein the second electrodes of each column of the second OLED pixels are plane electrodes, and second electrodes of the first OLED pixels and the second electrodes of the columns of the second OLED pixels are connected to form a plane electrode.

15. The OLED array substrate according to claim 1, wherein projection of a first electrode corresponding to each of the second OLED pixels on a plane where the OLED array substrate is located shapes as any one or a combination of a circular, an elliptical, a dumbbell, a cucurbit, or a rectangle.

16. The OLED array substrate according to claim 1, wherein when the set of the at least one column of the second OLED pixels is in one row and multiple columns, first electrodes and light-emitting structures corresponding to each of the at least one column of the second OLED pixels extend along a column direction in a section in a middle of the transparent display area, or extend from a top end to the middle portion and a bottom of the transparent display area, or extend from a middle portion to the bottom of the transparent display area.

17. The OLED array substrate according to claim 1, wherein when the set of the at least one column of the second OLED pixels is in two rows and multiple columns,
first electrodes and light-emitting structures corresponding to a column of the second OLED pixels in a first row extend along a column direction in a section in a middle and upper of the transparent display area, or extend from a top end to middle and upper portion and a middle portion of the transparent display area, or extend from middle and upper portion to the middle of the transparent display area; and
first electrodes and light-emitting structures corresponding to a column of the second OLED pixels in a second row extend along the column direction in a section of a middle-lower portion of the transparent display area, or extend from a bottom upward to the middle and lower portion and the middle portion of the transparent display area, or extend from the middle and lower portion to the middle portion of the transparent display area.

18. A display panel, comprising the OLED array substrate according to claim 1.

19. A display device, comprising the display panel according to claim 18.

* * * * *